(12) United States Patent
Ebata et al.

(10) Patent No.: US 11,183,317 B2
(45) Date of Patent: Nov. 23, 2021

(54) STACKED WIRING MEMBER

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Daisuke Ebata, Mie (JP); Yuya Fukami, Mie (JP); Hitoshi Hasegawa, Mie (JP); Suguru Yasuda, Mie (JP); Ryuta Takakura, Mie (JP); Yuki Matsuo, Mie (JP); Tetsuya Nishimura, Mie (JP); Haruka Nakano, Mie (JP); Masaki Mizushita, Mie (JP); Kenta Arai, Mie (JP); Motohiro Yokoi, Mie (JP); Kenta Ito, Mie (JP); Shigeki Ikeda, Mie (JP); Housei Mizuno, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/058,303

(22) PCT Filed: Feb. 26, 2019

(86) PCT No.: PCT/JP2019/007284
§ 371 (c)(1),
(2) Date: Nov. 24, 2020

(87) PCT Pub. No.: WO2019/225099
PCT Pub. Date: Nov. 28, 2019

(65) Prior Publication Data
US 2021/0193349 A1 Jun. 24, 2021

(30) Foreign Application Priority Data

May 25, 2018 (JP) .............................. JP2018-100772

(51) Int. Cl.
*H01B 7/08* (2006.01)
(52) U.S. Cl.
CPC .................................. *H01B 7/08* (2013.01)
(58) Field of Classification Search
CPC ......... H01B 7/08; H01B 7/0838; H01B 7/045
(Continued)

(56) References Cited

U.S. PATENT DOCUMENTS 5,857,259 A * 1/1999 Johnston .............. H01R 12/592
29/858
10,737,342 B2 * 8/2020 Wu ...................... H01R 12/778
(Continued)

FOREIGN PATENT DOCUMENTS

EP 1 209 700 5/2002
JP 10-223056 8/1998
(Continued)

OTHER PUBLICATIONS

International Search Report (ISR) issued in International Patent Application No. PCT/JP2019/007284, dated Apr. 23, 2019, along with an English translation thereof.
(Continued)

*Primary Examiner* — Chau N Nguyen
(74) *Attorney, Agent, or Firm* — Greenblum & Bernstein, P.L.C.

(57) ABSTRACT

A stacked wiring member includes a plurality of stacked flat wiring members. Each of the plurality of flat wiring members includes a plurality of wire-like transmission members and a base member keeping the plurality of wire-like transmission members in a parallel state in at least a part of the
(Continued)

plurality of wire-like transmission members in an extension direction thereof. Wire-like transmission members having different thicknesses in the plurality of wire-like transmission members are disposed to be located together in a stacked direction of the plurality of flat wiring members.

4 Claims, 5 Drawing Sheets

(58) Field of Classification Search
USPC .................................. 174/72 A, 115, 117 F
See application file for complete search history.

(56) References Cited

U.S. PATENT DOCUMENTS

| | | | |
|---|---|---|---|
| 10,861,622 B2* | 12/2020 | Chung | ................. H01B 7/0823 |
| 2002/0062981 A1 | 5/2002 | Nuyten et al. | |
| 2013/0240243 A1 | 9/2013 | Gundel et al. | |
| 2019/0166713 A1* | 5/2019 | Chen | ................. H01R 12/7076 |

FOREIGN PATENT DOCUMENTS

| | | |
|---|---|---|
| JP | 2015-72798 | 4/2015 |
| WO | 2012/030361 | 3/2012 |

OTHER PUBLICATIONS

International Preliminary Report on Patentability (IPRP) issued in International Patent Application No. PCT/JP2019/007284, dated May 29, 2020, along with an English translation thereof.
Japan Office Action issued in Japan Patent Application No. 2018-100772, dated Aug. 3, 2021, together with English translation thereof.

* cited by examiner

STACKED WIRING MEMBER

TECHNICAL FIELD

The present disclosure relates to a stacked wiring member.

BACKGROUND ART

Patent Document 1 discloses a wire harness including an electrical wire, a protection sheet wrapped around the electrical wire, and an adhesive tape attaching the protection sheet to the electrical wire. A cross section of this wire harness has a circular shape.

PRIOR ART DOCUMENTS

Patent Documents

Patent Document 1: Japanese Patent Application Laid-Open No. 2015-72798

SUMMARY

Problem to be Solved by the Invention

When the cross section of the wire harness has the circular shape, a gap of a space for arranging the wire harness needs to be increased.

A thickness of a wiring member is desired to be reduced.

Accordingly, an object of the present disclosure is to provide a technique capable of reducing a thickness of a stacked wiring member made up of stacked flat wiring members as much as possible.

Means to Solve the Problem

A stacked wiring member according to the present disclosure includes a plurality of flat wiring members which are stacked, wherein each of the plurality of flat wiring members includes a plurality of wire-like transmission members and a base member keeping the plurality of wire-like transmission members in a parallel state in at least a part of the plurality of wire-like transmission members in an extension direction, and wire-like transmission members having different thicknesses in the plurality of wire-like transmission members are disposed to be located together in a stacked direction of the plurality of flat wiring members.

Effects of the Invention

According to the present disclosure, a thickness of a stacked wiring member made up of stacked flat wiring members can be reduced as much as possible.

DESCRIPTION OF EMBODIMENT(S)

Description of Embodiment of Present Disclosure

Figure 1:
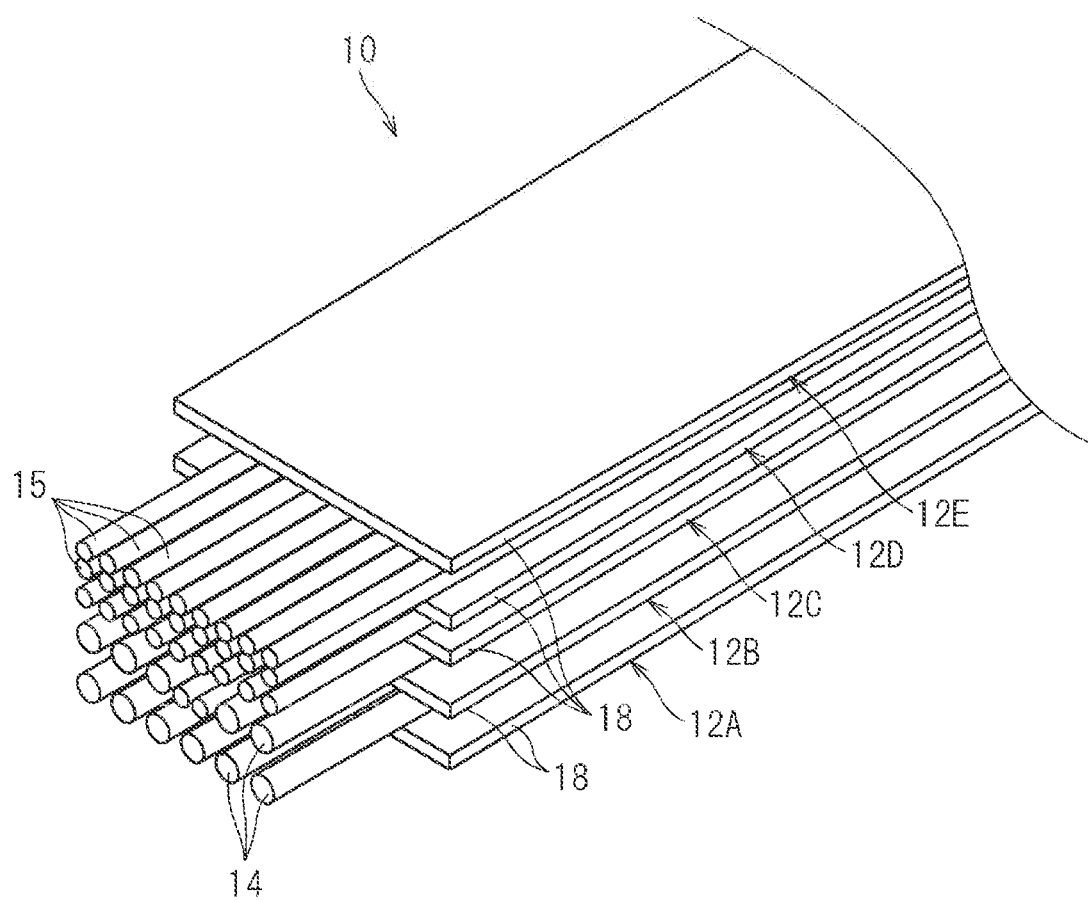
FIG. 1 is a schematic perspective view illustrating a stacked wiring member according to a first embodiment.

Embodiments of the present disclosure are listed and described firstly.

A stacked wiring member according to the present disclosure is as follows.

(1) A stacked wiring member according to the present disclosure is a stacked wiring member including a plurality of flat wiring members which are stacked, wherein each of the plurality of flat wiring members includes a plurality of wire-like transmission members and a base member keeping the plurality of wire-like transmission members in a parallel state in at least a part of the plurality of wire-like transmission members in an extension direction, and wire-like transmission members having different thicknesses in the plurality of wire-like transmission members are disposed to be located together in a stacked direction of the plurality of flat wiring members.

The wire-like transmission members having different thicknesses in the plurality of wire-like transmission members are disposed to be located together in the stacked direction of the plurality of flat wiring members, thus suppressed is an arrangement of only relatively thick wire-like transmission members side-by-side in the stacked direction of the plurality of flat wiring members. Accordingly, a thickness of a stacked wiring member made up of stacked flat wiring members can be reduced as much as possible.

(2) It is also applicable that the plurality of flat wiring members include a first flat wiring member and a second flat wiring member, and the plurality of wire-like transmission members included in the second flat wiring member are thinner than the wire-like transmission member included in the first flat wiring member.

Accordingly, in a configuration that the plurality of flat wiring members including the first flat wiring member and the second flat wiring member are stacked, suppressed is an arrangement of the plurality of relatively thick wire-like transmission members side-by-side in the stacked direction, thus thick wire-like transmission member and the thin wire-like transmission member are located together. Accordingly, a thickness of a stacked wiring member made up of stacked flat wiring members can be reduced as much as possible.

(3) It is also applicable that the plurality of flat wiring members include a first co-located flat wiring member and a second co-located flat wiring member having different thicknesses as the plurality of wire-like transmission members, and a relatively thick wire-like transmission member in the plurality of wire-like transmission members included in the second co-located flat wiring member is disposed in a position corresponding to a part where a relatively thin wire-like transmission member in the plurality of wire-like transmission members included in the first co-located flat wiring member is disposed.

Accordingly, the relatively thick wire-like transmission member in the plurality of wire-like transmission members included in the second co-located flat wiring member can be disposed in a gap caused by the part where the relatively thin wire-like transmission member in the plurality of wire-like transmission members included in the first co-located flat wiring member is disposed. Accordingly, a thickness of a stacked wiring member made up of stacked flat wiring members can be reduced as much as possible.

(4) It is also applicable that each of the first co-located flat wiring member and the second co-located flat wiring member is a member in which the plurality of wire-like transmission members are disposed on one main surface of a sheet material as the base member, and the first co-located flat wiring member and the second co-located flat wiring member are adjacent to each other in a posture where the sheet material of each of the first co-located flat wiring member and the second co-located flat wiring member faces a side opposite to each other.

The relatively thick wire-like transmission member in the plurality of wire-like transmission members included in the second co-located flat wiring member can be effectively disposed in a gap caused by the part where the relatively thin wire-like transmission member in the plurality of wire-like transmission members included in the first co-located flat wiring member is disposed.

(5) It is also applicable that each of the plurality of flat wiring members is a member in which the plurality of wire-like transmission members are disposed on one main surface of a sheet material as the base member. The plurality of wire-like transmission members are disposed on the sheet material, thus the flat wiring member can be achieved.

(6) The sheet material of each of the flat wiring members in the plurality of flat wiring members located on both outer sides in the stacked direction faces outside. Accordingly, the wire-like transmission member can be protected by the sheet material.

DETAILS OF EMBODIMENT OF PRESENT DISCLOSURE

Specific examples of a stacked wiring member of the present disclosure are described hereinafter with reference to the drawings. The present invention is not limited to these examples, but is indicated by claims, and it is intended that meanings equivalent to claims and all modifications within a scope of claims are included.

Embodiment 1

Figure 2:
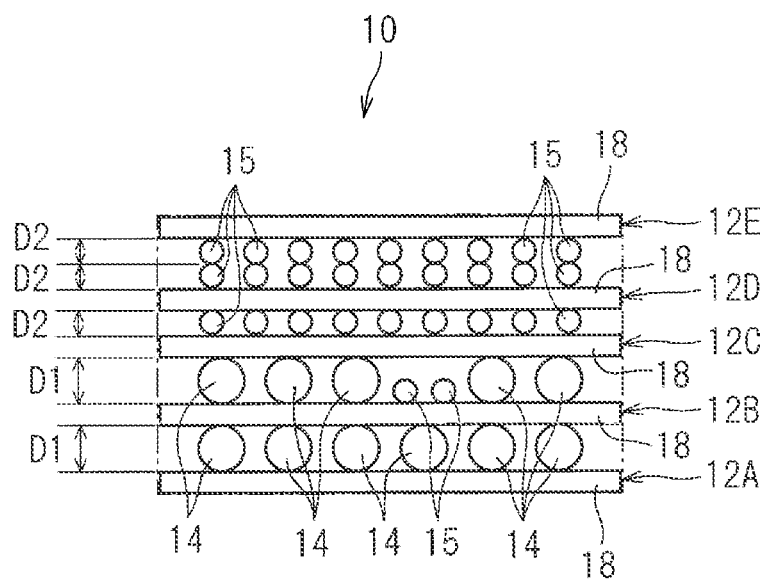
FIG. 2 is a schematic cross-sectional view of the stacked wiring member described above.

A stacked wiring member according to a first embodiment is described hereinafter. FIG. 1 is a schematic perspective view illustrating a stacked wiring member 10, and FIG. 2 is a schematic cross-sectional view of the stacked wiring member 10.

The stacked wiring member 10 includes a plurality of stacked flat wiring members 12A, 12B, 12C, 12D, and 12E.

The plurality of flat wiring member 12A, 12B, 12C, 12D, and 12E are members connecting components mounted to a vehicle. Each of the plurality of flat wiring members 12A, 12B, 12C, 12D, and 12E includes a plurality of wire-like transmission members 14 and 15 and a base member 18.

The wire-like transmission members 14 and 15 are wire-like members transmitting electricity or light, for example. Described herein as an example is that the wire-like transmission members 14 and 15 are insulated wires 14 and 15 each including a core wire and an insulating covering for covering the core wire. The core wire is made up of one or a plurality of strands. The strand is formed of a conductor made of copper, copper alloy, aluminum, or aluminum alloy, for example. The insulating covering is formed of a resin material such as polyvinyl chloride (PVC) or polyethylene (PE) extrusion-molded around the core wire.

The insulated wires 14 and 15 include insulated wires 14 and 15 having different thicknesses. Herein, the insulated wire 14 is thicker than the insulated wire 15.

The base member 18 is a member keeping at least a part of the plurality of wire-like transmission members 14 and 15 in a flat state in an extension direction thereof.

An example of the base member 18 being the sheet material 18 is described herein. A material constituting the sheet material 18 is not particularly limited. The sheet material 18 is preferably formed of a material containing resin such as polyvinyl chloride (PVC), polyethylene terephthalate (PET), and polypropylene (PP), for example. The sheet material 18 may be a sheet material with an inner portion evenly filled or a non-woven sheet, for example. The sheet material 18 may contain a material such as metal, for example. The sheet material 18 preferably has flexibility of easily bending in a thickness direction. The sheet material 18 may be a single layer or may be a plurality of laminated layers. When the sheet material 18 is the plurality of laminated layers, it is considered that a resin layer and a resin layer are laminated, for example. It is also considered that a resin layer and a metal layer are laminated, for example.

In the example illustrated in FIG. 1, the sheet material 18 is formed to have a quadrangular shape, however, the shape of the sheet material 18 is not limited thereto. The sheet material 18 may be formed into a shape corresponding to an arrangement route of the insulated wires 14 and 15, for example.

The plurality of insulated wires 14 and 15 are disposed on one main surface of the sheet material 18 in each of the plurality of flat wiring members 12A, 12B, 12C, 12D, and 12E.

A configuration of holding the plurality of insulated wires 14 and 15 on the main surface of the sheet material 18 is not particularly limited.

Welding is adopted herein as a configuration of joining the electrical wire and the sheet material. That is to say, at least one of the electrical wire and the sheet material has a resin material, and the resin material is melt to be joined to the other element. Herein, the insulating covering and the resin sheet material are melted together and mutually joined. In this case, the insulating covering and the resin sheet material preferably contain the same resin material.

The welding configuration is not particularly limited, however, adoptable are various welding configuration such as ultrasonic welding, heating and pressurizing welding, hot-air welding, and high-frequency welding.

A resin of at least the electrical wire and the sheet material may be melted by heat or a solvent and joined. A known joining configuration such as melting and joining, fusion, and welding can be adopted as the joining means.

Figure 3:
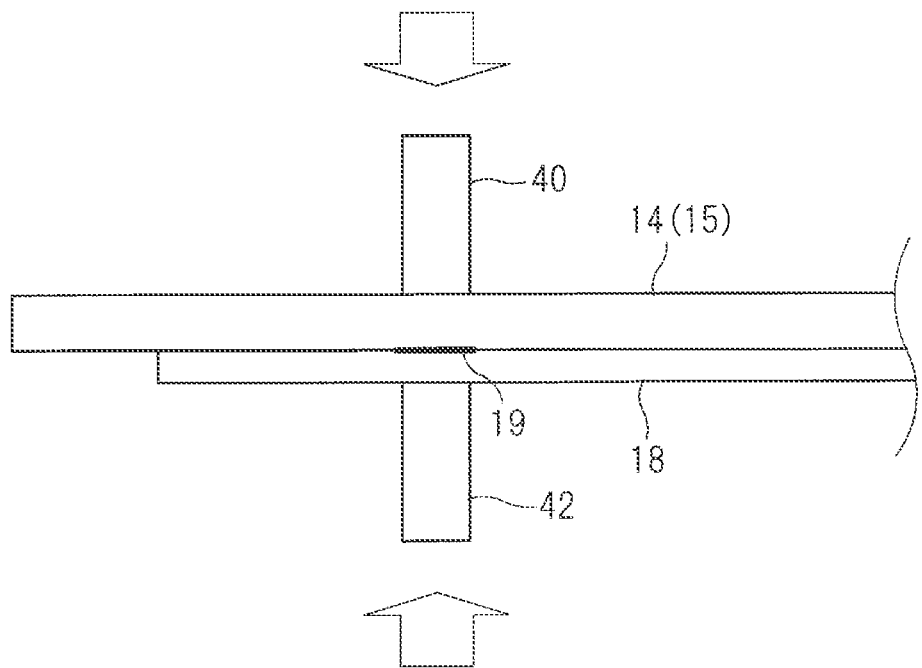
FIG. 3 is an explanation diagram illustrating a process of ultrasonic-joining an insulated wire to a sheet material.

Specifically, as illustrated in FIG. 3, for example, it is also applicable to sandwich the insulated wires 14 and 15 and the sheet material 18 between a chip 40 and an anvil 42 for ultrasonic joining to ultrasonic-weld the insulated wires 14 and 15 to the sheet material 18. In this case, the insulated wires 14 and 15 and the sheet material 18 are joined with a joint part 19, which is made up of at least one of the insulated wires 14 and 15 and the sheet material 18 which has been melted, therebetween.

Figure 4:
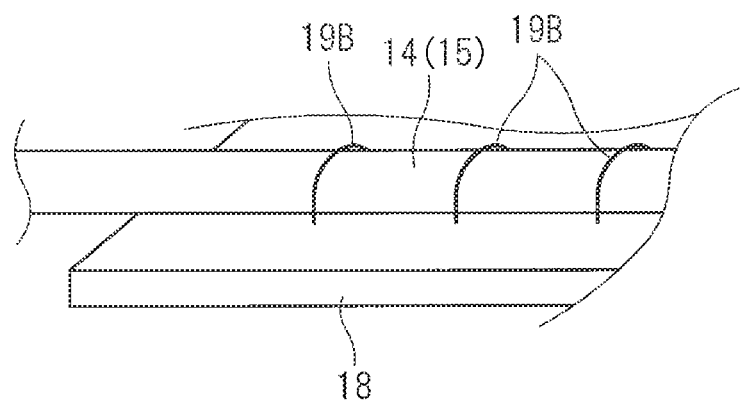
FIG. 4 is an explanation drawing illustrating the insulated wire sewn to the sheet material with a sewing thread.

The insulated wires 14 and 15 and the sheet material 18 may be welded by thermal welding, or may also be joined by an adhesive agent or a double-sided tape, for example. As illustrated in FIG. 4, the insulated wires 14 and 15 may be sewn and joined to the sheet material 18 with a sewing thread 19B.

Herein, a plurality of (six herein) relatively thick insulated wires 14 are held on one main surface of the flat wiring member 12A in a parallel state by one main surface of the sheet material 18.

At least one (five herein) relatively thick insulated wire 14 and at least one (two herein) relatively thin insulated wire 15 are held on one main surface of the flat wiring member 12B in a parallel state by one main surface of the sheet material 18. Herein, the relatively thick insulated wires 14 are provided on both outer sides in a width direction of the sheet material 18 and the relatively thin insulated wires 15 are provided in a center in the width direction of the sheet material 18.

The plurality of (nine herein) relatively thin insulated wires 15 are held on one main surface of the flat wiring members 12C, 12D, and 12E in a parallel state by one main surface of the sheet material 18.

There may be a part where the plurality of insulated wires 14 and 15 are not kept in the parallel state but are branched or curved in the plurality of flat wiring members 12A, 12B, 12C, 12D, and 12E.

When the insulated wires 14 and 15 are observed in whole, the insulated wire 14 is an example of the relatively thick insulated wire 14 and the insulated wire 15 is an example of the relatively thin insulated wire 15.

The flat wiring member 12A described above is an example of the first flat wiring member 12A including the plurality of relatively thick insulated wires 14.

The flat wiring members 12C, 12D, and 12E are examples of the second flat wiring members 12C, 12D, and 12E each including the insulated wire 15 thinner than the insulated wire 14 included in the first flat wiring member 12A.

The flat wiring member 12B includes the thick insulated wire 14 and the thin insulated wire 15, thus is neither the first flat wiring member nor the second flat wiring member.

In the stacked wiring member 10, the insulated wires having different thicknesses in the plurality of insulated wires 14 and 15 are disposed to be located together in a stacked direction (also a thickness direction thereof) of the plurality of flat wiring members 12A, 12B, 12C, 12D, and 12E.

Herein, the plurality of flat wiring members 12A, 12B, 12C, 12D, and 12E are stacked from a lower side to an upper side in this order. In this state, parallel state retaining parts of the plurality of insulated wires 14 and 15 in each of the plurality of flat wiring members 12A, 12B, 12C, 12D, and 12E are disposed to be overlapped with each other on the same region with a parallel direction aligned.

Herein, as described above, the relatively thick insulated wire 14 is held in the flat wiring member 12A. The relatively thin insulated wire 15 is held in the flat wiring members 12C, 12D, and 12E. Assumed is a case where a stacked body of the plurality of flat wiring members 12A, 12B, 12C, 12D, and 12E is observed in the stacked direction thereof. The stacked body has a configuration that the relatively thin insulated wire 15 is disposed on an upper side of the relatively thick insulated wire 14, thus the insulated wires 14 and 15 having different thicknesses are disposed to be located together. Thus, suppressed is an arrangement of only the plurality of relatively thick insulated wires 14 in the stacked direction, and reduction in the thickness of the stacked body can be achieved.

It is preferable that the insulated wires 14 and 15 having different thicknesses are located together in the stacked direction regarding all the plurality of insulated wires 14 and 15 in the parallel direction, however, this configuration is not necessary. The reason is that when the insulated wires 14 and 15 having different thicknesses are located together in the stacked direction even in a part of the plurality of insulated wires 14 and 15 in the parallel direction, the reduction in the thickness can be expected in that part.

A structure of maintaining the plurality of flat wiring members 12A, 12B, 12C, 12D, and 12E in a stacked state is not particularly limited. For example, also applicable is a structure that a banding member such as an adhesive tape is wound around the stacked body of the plurality of flat wiring members 12A, 12B, 12C, 12D, and 12E. The plurality of flat wiring members 12A, 12B, 12C, 12D, and 12E may be bonded by an adhesive agent or a double-sided tape, for example, intervening therebetween. Also applicable is a configuration that the sheet materials 18 on both sides of the plurality of flat wiring members 12A, 12B, 12C, 12D, and 12E are joined by welding, an adhesive tape, or an adhesive agent, or kept in an overlapping state by a clamp, for example.

In the present embodiment, the sheet materials 18 of the flat wiring members 12A and 12E located on both outer sides in the stacked direction in the plurality of flat wiring members 12A, 12B, 12C, 12D, and 12E are disposed to face outside. More specifically, the sheet materials 18 are disposed on a lower side in the plurality of flat wiring members 12A, 12B, 12C, and 12D. The flat wiring member 12E is vertically inverted, and the sheet material 18 is disposed on an upper side. Thus, when the stacked body of the plurality of flat wiring members 12A, 12B, 12C, 12D, and 12E is observed as a whole, the sheet material 18 is located on the outer side in the stacked direction on the both sides in the stacked direction. Thus, the insulated wires 14 and 15 are configured to be disposed between the sheet materials 18 on the both outer sides.

Figure 5:
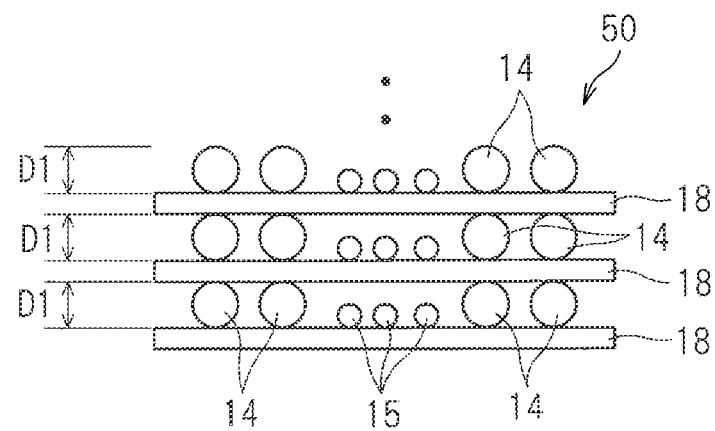
FIG. 5 is a schematic cross-sectional view illustrating a stacked wiring member according to a comparison example.

FIG. 5 illustrates a configuration that the relatively thick insulated wire 14 and the relatively thin insulated wire 15 are mixedly located on the sheet material 18 of each of the plurality of flat wiring members 50 and these flat wiring members 50 are stacked as a comparison example. In this case, intervals D1 each conforming to the relatively thick insulated wire 14 are provided between all the sheet materials 18.

In contrast, in the present embodiment, an interval D1 corresponding to a diameter of the relatively thick insulated wire 14 is provided between the sheet material 18 of the flat wiring member 12A and the sheet material 18 of the flat wiring member 12B. The interval D1 corresponding to the diameter of the relatively thick insulated wire 14 is provided between the sheet material 18 of the flat wiring member 12B and the sheet material 18 of the flat wiring member 12C. However, an interval D2 corresponding to a diameter of the relatively thin insulated wire 15 is provided between the sheet material 18 of the flat wiring member 12C and the sheet material 18 of the flat wiring member 12D. There is no thick insulated wire 14 between the sheet material 18 of the flat wiring member 12D and the sheet material 18 of the flat wiring member 12E, thus an interval (D2+D2) corresponding to twice the diameter of the relatively thin insulated wire 15 is provided.

Thus, the interval D2 between the sheet material 18 of the flat wiring member 12C and the sheet material 18 of the flat wiring member 12D and the interval (D2+D2) between the sheet material 18 of the flat wiring member 12D and the sheet material 18 of the flat wiring member 12E can be reduced. For example, each of the interval D2 and the interval (D2+D2) can be a relatively small interval where the relatively thin insulated wire 15 can be disposed in one or two layers, thus can be made small. As a result, the thicknesses of the plurality of flat wiring members 12A, 12B, 12C, 12D, and 12E can be reduced as much as possible.

According to the stacked wiring member 10 having the above configuration, the insulated wires 14 and 15 having different thicknesses in the plurality of insulated wires 14 and 15 are disposed to be located together in the stacked direction of the plurality of flat wiring members 12A, 12B, 12C, 12D, and 12E. Thus, suppressed is the arrangement of the relatively thick insulated wires 14 side by side in the stacked direction. Thus, a thickness of the stacked wiring member made up of stacked flat wiring members 12A, 12B, 12C, 12D, and 12E can be reduced as much as possible. Accordingly, a space-saving wiring of the stacked wiring member 10 can be achieved.

Specifically, the first flat wiring member 12A includes the plurality of relatively thick insulated wires 14, and the plurality of insulated wires 15 included in the second flat wiring members 12C, 12D, and 12E are thinner than the insulated wire 14 included in the first flat wiring member 12A. Assumed herein is a configuration of stacking the plurality of flat wiring members 12A, 12B, 12C, 12D, and 12E including the first flat wiring member 12A and the second flat wiring members 12C, 12D, and 12E. Suppressed in the stacking direction in this configuration is the arrangement of the plurality of relatively thick insulated wires 14 side-by-side, thus the thick insulated wire 14 and the thin insulated wire 15 are located together. Thus, the thickness of the stacked wiring member 10 made up of stacked flat wiring members 12A, 12B, 12C, 12D, and 12E can be reduced as much as possible.

The flat wiring members 12A, 12B, 12C, 12D, and 12E are configured to hold the plurality of insulated wires 14 and 15 on one main surface of the sheet material 18, thus when the plurality of insulated wires 14 and 15 are disposed on the sheet material 18, the flat wiring member can be easily achieved.

The sheet materials 18 of the flat wiring members 12A and 12E located on both outer sides in the stacked direction in the plurality of flat wiring members 12A, 12B, 12C, 12D, and 12E are disposed to face outside, thus the insulated wires 14 and 15 can be protected by the sheet material 18. The insulated wires 14 and 15 hardly come out of the stacked wiring member 10.

Figure 6:
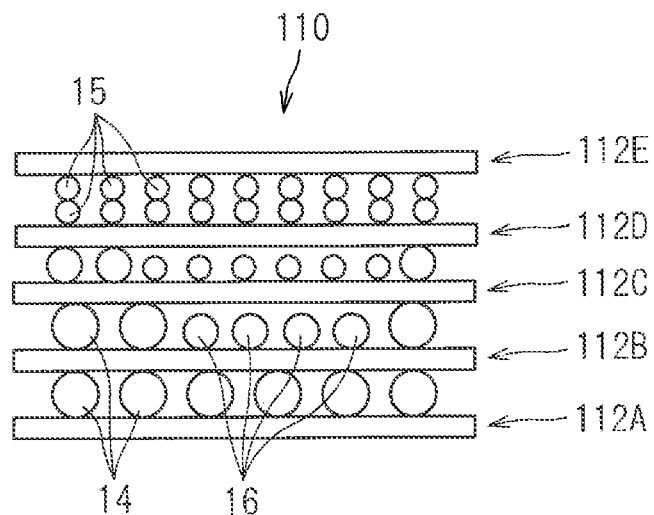
FIG. 6 is a schematic cross-sectional view illustrating a stacked wiring member according to a modification example.

The stacked wiring member 10 according to the first embodiment is also applicable to a case where the thicknesses of the insulated wires 14, 15, and 16 change in three or more stages as is a case in a stacked wiring member 110 according to a modification example illustrated in FIG. 6.

Herein, the insulated wire 14 is thickest, the insulated wire 15 is thinnest, and the insulated wire 16 has the thickness intermediate between the insulated wires 14 and 15. A flat wiring member 112A includes the relatively thick insulated wire 14. A flat wiring member 112B includes the relatively thick insulated wire 15 and the insulated wire 16 with the intermediate thickness. A flat wiring member 112C includes the insulated wire 16 with the intermediate thickness and the relatively thin insulated wire 15. Each of the flat wiring members 112D and 112E includes the relatively thin insulated wire 15.

The following configuration is considered in this case. The flat wiring member 112A is the first flat wiring member 112A including the plurality of relatively thick insulated wires 14. The flat wiring member 112C is the second flat wiring member 112C including the insulated wires 15 and 16 thinner than the insulated wire 14. The flat wiring members 112D and 112E are also the second flat wiring members 112D and 112E including the insulated wire 15 thinner than the insulated wire 14.

The following configuration can be also considered. The flat wiring member 112B is the first flat wiring member 112B including the plurality of relatively thick insulated wires 14 and the insulated wire 16 with the intermediate thickness. The flat wiring members 112D and 112E are the second flat wiring members 112D and 112E including the insulated wire 15 thinner than the insulated wires 14 and 16 included in the first flat wiring member 112B.

In any case, only the relatively thick insulated wires 14 or the insulated wires 16 with the intermediate thickness are not arranged in the stacked direction, but the thin insulated wires 14 are mixedly disposed with them, thus the thickness of the stacked wiring member 110 is reduced as much as possible.

Embodiment 2

Figure 7:
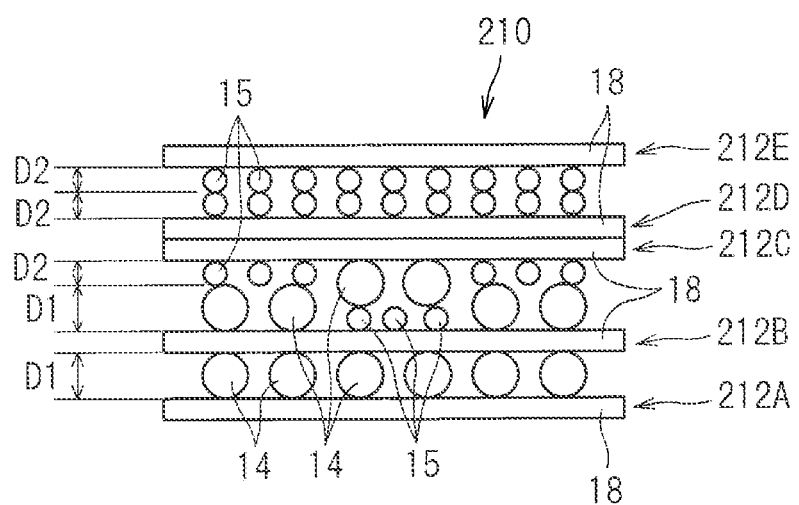
FIG. 7 is a schematic cross-sectional view illustrating a stacked wiring member according to a second embodiment.

A stacked wiring member 210 according to a second embodiment is described. FIG. 7 is a schematic cross-sectional view illustrating the stacked wiring member 210. In the following description of the present embodiment, the same reference numerals are assigned to the similar constituent elements described in the first embodiment, and the description thereof will be omitted.

The stacked wiring member 210 includes a plurality of stacked flat wiring members 212A, 212B, 212C, 212D, and 212E.

The plurality of flat wiring members 212A, 212B, 212C, 212D, and 212E have the configuration similar to the plurality of flat wiring members 12A, 12B, 12C, 12D, and 12E, and include the insulated wires 14 and 15 as an example of the plurality of wire-like transmission members and the base member 18.

The relatively thick insulated wire 14 is held in the flat wiring member 212A described above. The flat wiring member 212A can also be considered an example of the first flat wiring member 212A described in the first embodiment.

The relatively thin insulated wire 15 is held in the flat wiring members 212D and 212E. The flat wiring members 212D and 212E can also be considered an example of the second flat wiring members 212D and 212E including the insulated wire 15 thinner than the insulated wire 14 included in the first flat wiring member 212A.

The plurality of insulated wires 14 and 15 having different thicknesses are held in the flat wiring members 212B and 212C. Thus, the flat wiring member 212B is an example of the first co-located flat wiring member 212B including the plurality of insulated wires 14 and 15 having the different thicknesses. The flat wiring member 212C is also an example of the second co-located flat wiring member 212C including the plurality of insulated wires 14 and 15 having the different thicknesses.

In the stacked wiring member 210, the insulated wires having different thicknesses in the plurality of insulated wires 14 and 15 are disposed to be located together in a stacked direction (also a thickness direction thereof) of the plurality of flat wiring members 212A, 212B, 212C, 212D, and 212E.

Herein, the plurality of flat wiring members 212A, 212B, 212C, 212D, and 212E are stacked from a lower side to an upper side in this order. In this state, parallel state retaining parts of the plurality of insulated wires 14 and 15 in each of the plurality of flat wiring members 211A, 211B, 211C, 212D, and 212E are disposed to be overlapped with each other on the same region with a parallel direction aligned.

The insulated wires 14 and 15 having different thicknesses are held in the first co-located flat wiring member 212B as described above. At least one (two on each side) relatively thick insulated wire 14 is held on each of the both sides in the width direction of the sheet material 18 in the first co-located flat wiring member 212B, and at least one (two herein) relatively thin insulated wire 15 is held in an intermediate portion thereof.

The insulated wires 14 and 15 having different thicknesses are held in the second co-located flat wiring member 212C. At least one (two on each side) relatively thin insulated wire 15 is held on each of the both sides in the width direction of the sheet material 18 in the second co-located flat wiring member 212C, and at least one (two herein) relatively thick insulated wire 14 is held in an intermediate portion thereof.

When the sheet material 18 is observed in the width direction, the part of the first co-located flat wiring member 212B where the relatively thick insulated wire 14 is disposed corresponds to the part of the second co-located flat wiring member 212C where the relatively thin insulated wire 15 is disposed. The part of the first co-located flat wiring member 212B where the relatively thin insulated wire 15 is disposed corresponds to the part of the second co-located flat wiring member 212C where the relatively thick insulated wire 14 is disposed.

In the present embodiment, the first co-located flat wiring member 212B and the second co-located flat wiring member 212C are adjacent to each other in a posture where the sheet materials 18 thereof face sides opposite to each other. That is to say, the first co-located flat wiring member 212B is overlapped on the flat wiring member 212A in the same direction as the flat wiring member 212A. The second co-located flat wiring member 212C is overlapped on the first co-located flat wiring member 212B in a state where two sides thereof are inverted.

When the wiring member is observed in accordance with a relationship between the first co-located flat wiring member 212B and the second co-located flat wiring member 212C, the relatively thick insulated wire 14 in the insulated wires 14 and 15 included in the second co-located flat wiring member 212C is disposed in a position corresponding to a part where the relatively thin insulated wire 15 in the plurality of insulated wires 14 and 15 included in the first co-located flat wiring member 212B is disposed (a center in the width direction). That is to say, when the first co-located flat wiring member 212B is observed, a space recessed more than the relatively thick insulated wire 14 is formed in a part where the relatively thin insulated wire 15 in the plurality of insulated wires 14 and 15 is disposed. Thus, a protrusion part caused by the relatively thick insulated wire 14 in the plurality of insulated wires 14 and 15 held by the second flat wiring member 212C is disposed in the recessed space. In the relationship of the two insulated wires, a case where the two insulated wires are disposed in the corresponding positions in the stacked direction is a case where the two insulated wires have a positional relationship of being disposed to be overlapped in the width direction.

In contrast, the relatively thick insulated wire 14 in the insulated wires 14 and 15 included in the first co-located flat wiring member 212B is disposed in a position corresponding to a part where the relatively thin insulated wire 15 in the plurality of insulated wires 14 and 15 included in the second co-located flat wiring member 212C is disposed (both sides in the width direction). That is to say, when the second co-located flat wiring member 212C is observed, a space recessed more than the relatively thick insulated wire 14 is formed in a part where the relatively thin insulated wire 15 in the plurality of insulated wires 14 and 15 is disposed. Thus, a protrusion part caused by the relatively thick insulated wire 14 in the plurality of insulated wires 14 and 15 held by the first flat wiring member 112B is disposed in the recessed space.

That is to say, the relationship between the first co-located flat wiring member 212B and the second co-located flat wiring member 212C are a focus of attention. Configured therein is that the protrusion part caused by the relatively thick insulated wire 14 and the recessed part caused by the relatively thin insulated wire 15 are alternately provided. Accordingly, the protrusion part described above is housed in the recessed part, and the thickness dimension is reduced as much as possible as a whole.

When the first co-located flat wiring member 212B and the second co-located flat wiring member 212C are a focus of attention, the plurality of insulated wires 14 and 15 having different thicknesses are located together in the stacked direction. Accordingly, when the stacked wiring member 210 is seen as a whole, the plurality of insulated wires 14 and 15 having different thicknesses are located together in the stacked direction.

Also in the present embodiment, the relatively thick insulated wire 14 is held in the flat wiring member 212A. The relatively thin insulated wire 15 is held in the flat wiring members 212D and 212E. Thus, when the stacked body of the plurality of flat wiring members 212A, 212B, 212C, 212D, and 212E is observed in the stacked direction thereof, the relatively thin insulated wire 15 is disposed on an upper side of the relatively thick insulated wire 14. Also from this viewpoint, configured is that the insulated wires 14 and 15 having different thicknesses are disposed to be located together. According such a configuration, in the manner similar to the first embodiment described above, suppressed is an arrangement of only the plurality of relatively thick insulated wires 14 in the stacked direction, and reduction in the thickness of the stacked body can be achieved.

Also in the present embodiment, the sheet materials 18 of the flat wiring members 212A and 212E located on both outer sides in the stacked direction in the plurality of flat wiring members 212A, 212B, 212C, 212D, and 212E are disposed to face outside. Accordingly, the insulated wires 14 and 15 are configured to be disposed between the sheet materials 18 on the both outer sides.

In the present embodiment, an interval between the flat wiring member 212B and the flat wiring member 212C are equal to an interval corresponding to a sum of a diameter of the thick insulated wire 14 and the thin insulated wire 15 (D1+D2), thus the thickness of the stacked wiring member 210 can be reduced as much as possible.

An interval between the sheet material 18 of the flat wiring member 212A and the sheet material 18 of the flat wiring member 212B is an interval D1 corresponding to a diameter of the thick insulated wire 14, and the sheet material 18 of the flat wiring member 212C is in contact with the sheet material 18 of the flat wiring member 212D. There is no thick insulated wire 14 between the flat wiring member 212D and the flat wiring member 212E. Thus, the interval therebetween is an interval (D2+D2) corresponding to twice the diameter of the thin insulated wire 15. Also from this viewpoint, the thickness of the stacked wiring member 210 can be reduced as much as possible.

According to the stacked wiring member 210 having the above configuration, the insulated wires 14 and 15 having different thicknesses in the plurality of insulated wires 14 and 15 are disposed to be located together in the stacked direction of the plurality of flat wiring members 212A, 212B, 212C, 212D, and 212E. Thus, suppressed is the arrangement of the relatively thick insulated wires 14 side by side in the stacked direction. Accordingly, the thickness of the stacked wiring member made up of the stacked flat wiring members 212A, 212B, 212C, 212D, and 212E can be reduced as much as possible. Accordingly, a space-saving wiring of the stacked wiring member 10 can be achieved.

Specifically, the plurality of flat wiring members 212A, 212B, 212C, 212D, and 212E include the first co-located flat wiring member 212B and the second co-located flat wiring member 212C including the plurality of insulated wires 14 and 15 having different thicknesses as the plurality of wire-like transmission members. The relatively thick insulated wire 14 in the plurality of insulated wires 14 and 15 included in the second co-located flat wiring member 212C is disposed in a position corresponding to a part where the relatively thin insulated wire 15 in the plurality of insulated wires 14 and 15 included in the first co-located flat wiring member 212B is disposed. Accordingly, achieved is a configuration that the plurality of flat wiring members 212A, 212B, 212C, 212D, and 212E are stacked with a thickness dimension as small as possible.

Furthermore, the first co-located flat wiring member 212B and the second co-located flat wiring member 212C are adjacent to each other in a posture where the sheet materials 18 thereof face sides opposite to each other. Thus, the relatively thick insulated wire 15 in the plurality of insulated wires 14 and 15 included in the second co-located flat wiring member 212C is effectively disposed in a gap generated by the part where the relatively thin insulated wire 14 in the plurality of insulated wires 14 and 15 included in the first co-located flat wiring member 212B is disposed.

In the manner similar to the first embodiment described above, the first flat wiring member 212A includes the plurality of relatively thick insulated wires 14, and the plurality of insulated wires 15 included in the second flat wiring members 212D and 212E are thinner than the insulated wire 14 included in the first flat wiring member 212A. Thus, also from this viewpoint, the thickness of the stacked wiring member 10 can be reduced as much as possible.

The flat wiring members 212A, 212B, 212C, 212D, and 212E are configured to hold the plurality of insulated wires 14 and 15 on one main surface of the sheet material 18, thus when the plurality of insulated wires 14 and 15 are disposed on the sheet material 18, the flat wiring member can be easily achieved.

The sheet materials 18 of the flat wiring members 212A and 212E located on both outer sides in the stacked direction in the plurality of flat wiring members 212A, 212B, 212C, 212D, and 212E are disposed to face outside. Accordingly, the insulated wires 14 and 15 can be protected by the sheet material 18. The insulated wires 14 and 15 hardly come out of the stacked wiring member 10.

Figure 8:
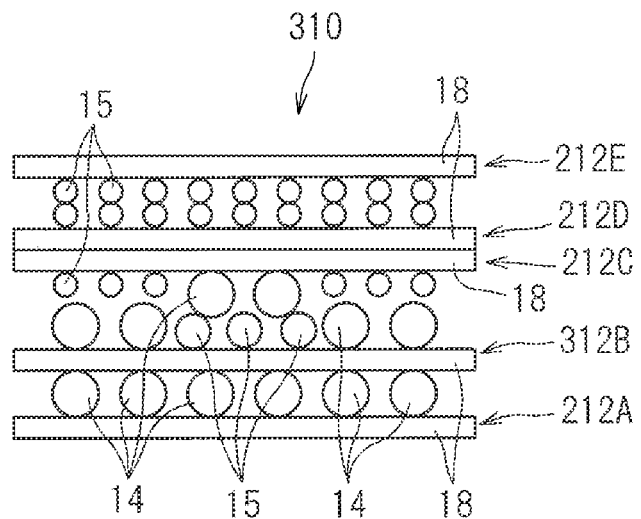
FIG. 8 is a schematic cross-sectional view illustrating a stacked wiring member according to another modification example.

The stacked wiring member 210 according to the second embodiment is also applicable to a case where the thicknesses of the insulated wires 14, 15, and 16 change in three or more stages as is a case in a stacked wiring member 310 according to a modification example illustrated in FIG. 8.

Herein, the insulated wire 14 is thickest, the insulated wire 15 is thinnest, and the insulated wire 16 has the thickness intermediate between the insulated wires 14 and 15. The stacked wiring member 310 is different from the stacked wiring member of the embodiment described above in that in a flat wiring member (first co-located flat member) 312B corresponding to the flat wiring member 212B, the insulated wire 16 with the intermediate thickness is held in the center of the sheet material 18 in the width direction instead of the relatively thin insulated wire 15.

Also in this case, the relatively thick insulated wire 14 in the plurality of insulated wires 14 and 15 included in the second co-located flat wiring member 212C is disposed in a position corresponding to a part where the relatively thin insulated wire 16 in the plurality of insulated wires 14, 15, and 16 included in the first co-located flat wiring member 312B is disposed. Thus, in the manner similar to the above description, the thickness dimension of the stacked wiring member 310 can be reduced as much as possible.

Figure 9:
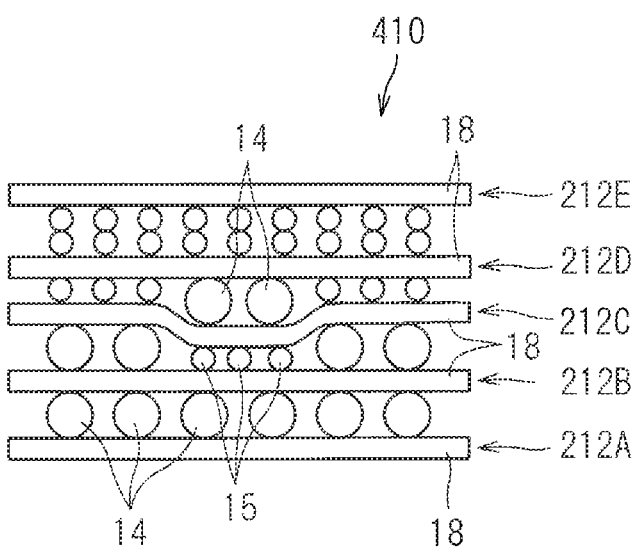
FIG. 9 is a schematic cross-sectional view illustrating a stacked wiring member according to still another modification example.

It is not necessary that the sheet materials 18 of the first co-located flat wiring member 212B and the second co-located flat wiring member 212C face the sides opposite to each other as is the case in the second embodiment described above. For example, a configuration of a stacked wiring member 410 according to a modification example illustrated in FIG. 9 is also applicable. For example, when the sheet material 18 is flexibly deformed, the sheet material 18 of the second co-located flat wiring member 212C is deformed in accordance with a shape corresponding to a space caused by the thin insulated wire 15 of the first co-located flat wiring member 212B. Then, a protrusion part caused by the thick insulated wire 14 in the second flat co-located flat wiring member 212C can be disposed in a space caused by the thin insulated wire 15 of the first co-located flat wiring member 212B.

Modification Example

The example that the wire-like transmission member is the insulated wire is described in each embodiment and each modification described above, however, the configuration of the wire-like transmission member is not limited thereto. The wire-like transmission member may be a wire-like member transmitting electricity or light, for example. For example, the wire-like transmission member may be a general wire having a core wire and a covering around the cores wire, or may also be a bare lead wire, a shielded wire, an enamel wire, a nichrome wire, or an optical fiber, for example.

The wire-like transmission member transmitting the electricity may be various kinds of signal lines or various kinds of power lines.

The flat wiring member may be a flexible flat cable (FFC) made up of parallelly-arranged wire-like conductors (wire-like transmission member) covered by an insulating covering (base member) such as a film or a flexible print circuit substrate (FPC) in which a print circuit (wire-like transmission member) is formed in an insulating member (base member) such as a resin film, for example. The flat wiring member may be a flat cable in which insulated wires are parallelly joined (a core wire in the insulated wire is the wire-like transmission member and a parallelly-joined insulating covering is a base member), for example These cases are also applicable as with the above description when thicknesses of conductors inside are different from each other.

Each configuration described in the above embodiments and modification examples thereof can be appropriately combined as long as they are not contradictory.

EXPLANATION OF REFERENCE SIGNS

10, 110, 210, 310, 410 stacked wiring member
12A flat wiring member (first flat wiring member)
12B flat wiring member
12C flat wiring member (second flat wiring member)
12D flat wiring member (second flat wiring member)
12E flat wiring member (second flat wiring member)
14, 15, 16 wire-like transmission member (insulated wire)
18 base member (sheet material)
19 joint part
19B sewing thread
40 chip
42 anvil
50 flat wiring member
112A flat wiring member (first flat wiring member)
112B flat wiring member (first flat wiring member)
112C flat wiring member (second flat wiring member)
112D flat wiring member
112E flat wiring member
212A flat wiring member (first flat wiring member)
212B flat wiring member (first flat wiring member, first co-located flat wiring member)
212C flat wiring member (second flat wiring member, second co-located flat wiring member)
212D flat wiring member (second flat wiring member)
212E flat wiring member (second flat wiring member)
312B first co-located flat wiring member

The invention claimed is:

1. A stacked wiring member, comprising
a plurality of stacked flat wiring members, wherein
each of the plurality of flat wiring members includes a plurality of wire-like transmission members and a base member keeping the plurality of wire-like transmission members in a parallel state in at least a part of the plurality of wire-like transmission members in an extension direction,
wire-like transmission members having different thicknesses in the plurality of wire-like transmission members are disposed to be located together in a stacked direction of the plurality of flat wiring members,
the plurality of flat wiring members include a first co-located flat wiring member and a second co-located flat wiring member having different thicknesses as the plurality of wire-like transmission members,
a relatively thick wire-like transmission member in the plurality of wire-like transmission members included in the second co-located flat wiring member is disposed in a position corresponding to a part where a relatively thin wire-like transmission member in the plurality of wire-like transmission members included in the first co-located flat wiring member is disposed,
each of the first co-located flat wiring member and the second co-located flat wiring member is a member in which the plurality of wire-like transmission members are disposed on one main surface of a sheet material as the base member,
the first co-located flat wiring member and the second co-located flat wiring member are adjacent to each other in a posture where the sheet material of each of the first co-located flat wiring member and the second co-located flat wiring member faces a side opposite to each other, and
an insulating covering of one of the wire-like transmission members included in the first co-located flat wiring member is in contact with an insulating covering of one of the wire-like transmission members included in the second co-located flat wiring member.

2. A stacked wiring member comprising
a plurality of stacked flat wiring members, wherein
each of the plurality of flat wiring members includes a plurality of wire-like transmission members and a base member keeping the plurality of wire-like transmission members in a parallel state in at least a part of the plurality of wire-like transmission members in an extension direction,
wire-like transmission members having different thicknesses in the plurality of wire-like transmission members are disposed to be located together in a stacked direction of the plurality of flat wiring members,
the plurality of flat wiring members include a first co-located flat wiring member and a second co-located flat wiring member having different thicknesses as the plurality of wire-like transmission members,
a relatively thick wire-like transmission member in the plurality of wire-like transmission members included in the second co-located flat wiring member is disposed in a position corresponding to a part where a relatively thin wire-like transmission member in the plurality of wire-like transmission members included in the first co-located flat wiring member is disposed,
each of the first co-located flat wiring member and the second co-located flat wiring member is a member in which the plurality of wire-like transmission members are disposed on one main surface of a sheet material as the base member,
the first co-located flat wiring member and the second co-located flat wiring member are adjacent to each other in a posture where the sheet material of each of the first co-located flat wiring member and the second co-located flat wiring member faces a side opposite to each other, and
one of the wire-like transmission members included in the first co-located flat wiring member is in contact with one of the wire-like transmission members included in the second flat wiring member,
the plurality of flat wiring members also include a first flat wiring member and a second flat wiring member, and
the plurality of wire-like transmission members included in the second flat wiring member are thinner than the wire-like transmission member included in the first flat wiring member.

3. The stacked wiring member according to claim 2, wherein
each of the first and second flat wiring members is a member in which the plurality of wire-like transmission members are disposed on one main surface of a sheet material as the base member.

4. The stacked wiring member according to claim 3, wherein
the sheet material of each of the first and second flat wiring members located on both outer sides in the stacked direction faces outside.

* * * * *